United States Patent [19]

Koenen

[11] Patent Number: 5,272,599
[45] Date of Patent: Dec. 21, 1993

[54] MICROPROCESSOR HEAT DISSIPATION APPARATUS FOR A PRINTED CIRCUIT BOARD

[75] Inventor: David J. Koenen, Houston, Tex.

[73] Assignee: Compaq Computer Corporation, Houston, Tex.

[21] Appl. No.: 34,346

[22] Filed: Mar. 19, 1993

[51] Int. Cl.$^5$ .............................................. H05K 7/20
[52] U.S. Cl. ................................... 361/710; 165/80.3; 165/185; 174/16.3; 257/707; 257/727
[58] Field of Search ........................... 165/80.3, 185; 174/16.3; 361/383, 386–389; 257/707, 727

[56] References Cited

U.S. PATENT DOCUMENTS

| | | | |
|---|---|---|---|
| 4,725,920 | 2/1988 | Ijichi et al. | 361/388 |
| 4,756,081 | 7/1988 | Penn | 361/387 |
| 4,916,575 | 4/1990 | Van Asten | 361/386 |
| 5,162,974 | 11/1992 | Currie | 361/386 |

FOREIGN PATENT DOCUMENTS

| | | | |
|---|---|---|---|
| 0291400 | 11/1988 | European Pat. Off. | 361/386 |
| 2413016 | 8/1979 | France | 361/386 |
| 0187295 | 8/1991 | Japan | 361/386 |

OTHER PUBLICATIONS

PCT/US91/03839 "Heat Sink for Heat Generating Components" Dec. 1991.

*Primary Examiner*—Gregory D. Thompson
*Attorney, Agent, or Firm*—Konneker, Bush & Hitt

[57] ABSTRACT

Operating heat from a computer microprocessor chip mounted on the top side of a printed circuit board is removed therefrom using a heat dissipation assembly including a metal heat transfer plate and a metal heat conductor block. The heat transfer plate is secured to the circuit board and has a first section which underlies the circuit board beneath the microprocessor chip, and a second portion projecting outwardly from an edge of the circuit board and secured to a wall of the metal housing cage of the computer. The metal heat conductor block extends through a complementarily configured opening formed in the circuit board beneath a central portion of the metal underside section of the chip. A top end of the block is bonded to the metal underside of the chip using heat conductive cement, and the bottom end of the block is removably secured to the top side of the first plate portion beneath the printed circuit board by a threaded fastener, a layer of heat conductive grease preferably being disposed between the bottom block end and the first plate portion. Operating heat from the chip is conducted downwardly through the metal block to the heat transfer plate and then through the plate to the metal chassis which serves as a large heat sink. Additionally, heat is dissipated from the plate by convection. This convective heat dissipation is preferably enhanced by securing a cooling fin structure to the second plate portion.

15 Claims, 1 Drawing Sheet

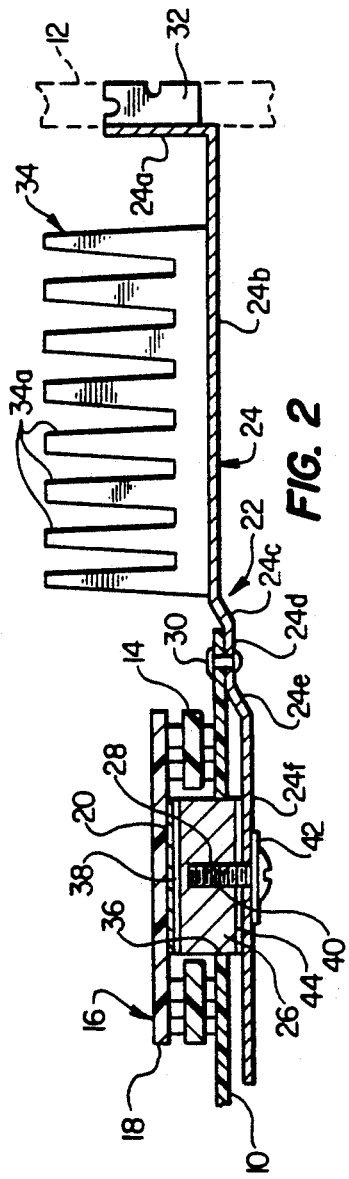
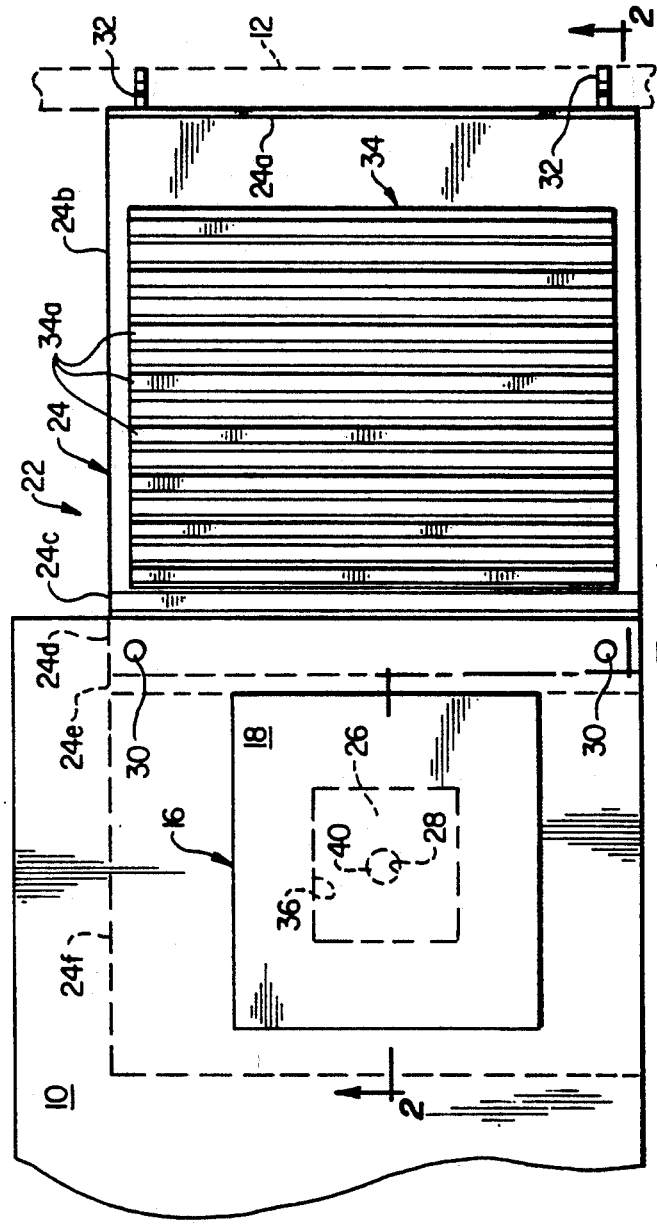

MICROPROCESSOR HEAT DISSIPATION APPARATUS FOR A PRINTED CIRCUIT BOARD

BACKGROUND OF THE INVENTION

1. Field of the Invention

The present invention generally relates to printed circuit board apparatus and, in a preferred embodiment thereof, more particularly relates to apparatus for dissipating heat from a printed circuit board-mounted microprocessor.

2. Description of Related Art

As the internal die size and clock frequency of printed circuit board-mounted computer microprocessor chips continue to be increased the internal heat generated within the chips is correspondingly elevated. This, in turn, makes it increasingly important that the generated chip heat be efficiently dissipated to prevent the chip operating temperature from exceeding the manufacturer's prescribed limit and thereby causing improper functioning or failure of the chip.

Microprocessors are normally encased in a ceramic material which, as is well known, is a relatively poor conductor of heat. Accordingly, heat generated within the chip during its operation is difficult to remove through the insulation-like ceramic shroud within which the chip circuitry is encased. A conventional approach to dissipating the internal chip heat has been to mount cooling fins on the top or outer side of the ceramic outer chip body portion.

The use of top-mounted cooling fins on modern, higher speed microprocessor chips has not proven to be entirely successful in adequately removing internally generated heat from the chips due to the relatively low heat transfer coefficient of the ceramic material between the microprocessor's core silicon and the top-mounted cooling fins. Additionally, the use of these top mounted cooling fins tends to block from view the trademark, serial number and other important information typically stamped on the top side of the chip by its manufacturer.

From the foregoing it can be readily seen that it would be highly desirable to provide printed circuit board-mounted microprocessor chips, of the type generally described above, with improved heat dissipation apparatus. It is accordingly an object of the present invention to provide such improved microprocessor chip heat dissipation apparatus.

SUMMARY OF THE INVENTION

In carrying out principles of the present invention, in accordance with a preferred embodiment thereof, apparatus is provided for dissipating internal operating heat generated by a computer microprocessor chip operatively and removably mounted on a top side of a printed circuit board disposed within a metal housing chassis. The microprocessor chip is spaced upwardly apart from the top side of the circuit board in a generally parallel relationship therewith and is of a conventional construction, having a ceramic body portion and a metal underside cover section.

The heat dissipation apparatus comprises an opening formed through the printed circuit board and underlying the metal underside section of the microprocessor chip, and a thermally conductive heat dissipation structure operative to receive internal operating heat generated by the microprocessor chip and conductively and convectively dissipate the received heat. The heat dissipation structure extends through the printed circuit board opening and has a first end portion secured to the metal underside section of the microprocessor chip in thermal communication thereof, and a second end portion secured to the metal housing chassis in thermal communication therewith.

Internal operating heat generated by the microprocessor chip is conducted through its metal underside section and into and through the heat dissipation structure to the metal housing cage structure which acts as a large heat sink. Additional chip operating heat is removed from the heat dissipation structure by convection.

The removal of the chip operating heat through its metal underside section via the heat dissipating structure to the metal housing chassis, as opposed to the conventional approach of attempting to remove the heat from the ceramic body portion of the chip via cooling fins mounted on its top side is substantially more efficient. Additionally, the absence of cooling fins on the top side of the chip conveniently leaves the important indicia typically imprinted thereon, such as the model and serial numbers, unobscured.

In a preferred embodiment thereof, the heat dissipation structure includes a sheet metal heat transfer plate and a metal heat conductor block. The heat conductor block is removably received in the printed circuit board opening and has an upper end surface fixedly secured to a central portion of the metal underside section of the chip with heat conductive cement, and a lower end surface spaced downwardly apart from the bottom side of the circuit board. The heat transfer plate is fixedly secured to an edge portion of the printed circuit board and has a first portion which underlies and is removably secured to the lower end surface of the heat conductor block with a threaded fastener, a layer of heat conductive grease being preferably interposed between the first heat transfer portion and the lower end surface of the heat conductor block.

A second portion of the heat transfer plate extends outwardly beyond the edge portion of the printed circuit board, representatively in the plane of the circuit board, and has an outer end secured to a wall of the metal housing chassis by bracket structures. The convective heat transfer from the heat dissipation structure may be augmented by connecting a cooling fin structure to the second heat transfer plate portion in thermal communication therewith.

BRIEF DESCRIPTION OF THE DRAWINGS

FIG. 1 is a simplified top plan view of a portion of a printed circuit board having a representative high speed computer microprocessor chip mounted on the top side thereof and thermally coupled to a unique heat dissipation structure embodying principles of the present invention; and FIG. 2 is a simplified, partly elevational cross-sectional view through the printed circuit board taken along line 2—2 of FIG. 1.

DETAILED DESCRIPTION

Illustrated in FIGS. 1 and 2 is a printed circuit board 10 mounted within a metal computer chassis, one wall 12 of which is shown in phantom. Removably mounted on the top side of the printed circuit board 10, by means of a conventional pin connector structure 14, is a representative high speed microprocessor chip 16 of conventional construction. Chip 16 has a thin rectangular configuration defined by a hollow rectangular ceramic body portion 18, within which the internal chip circuitry is encased, and a thin metal cover portion 20 over the die on the underside of the chip body 18.

As best illustrated in FIG. 2, the installed chip 16 is an upwardly spaced, parallel relationship with the top side of the printed circuit board 10. The pin connector structure 14 operatively couples the internal chip circuitry to the circuitry of the board 10. For purposes of illustrative clarity, the board circuitry has not been shown on the drawings.

To efficiently dissipate the heat generated by the microprocessor chip 16 during its operation, the present invention provides a unique heat dissipation assembly 22 which will now be described in detail. Assembly 22 includes a heat transfer plate 24, formed from a highly conductive sheet metal material such as aluminum or nickel-plated copper; and a highly conductive rectangular metal block 26, preferably a copper block, having a threaded circular bore 28 extending upwardly through its bottom side.

From right to left as viewed in FIG. 2, the heat transfer plate 24 has an upturned right end portion 24a; a flat portion 24b positioned to the right of the printed circuit board 10 and lying generally in the same plane therewith; a downwardly and leftwardly sloped portion 24c; a flat portion 24d underlying a right edge portion of the printed circuit board 10 and secured thereto with rivets 30 or other suitable fastening members; a downwardly and leftwardly sloped portion 24e; and a flat left end portion 24f extending beneath the printed circuit board in a parallel, downwardly spaced relationship therewith.

The upturned right end portion 24a of the heat transfer plate 24 is secured to the metal chassis wall 12, in a thermally conductive relationship with, by means of a spaced plurality of metal brackets 32. A metal cooling fin structure 34, defined by a mutually spaced series of prefabricated or sheet metal punched fins 34a, is preferably secured atop the heat transfer plate portion 24b.

The heat transfer plate portion 24f underlies a rectangular opening 36 formed through the printed circuit board 10 beneath a central portion of the metal underside cover section 20 of the microprocessor chip 16. Metal block 26 is complementarily received in the circuit board opening 36, with the top side of the block being secured to the underside of the metal chip cover section 20 with a layer of a suitable heat conducting cement material 38. The bottom side of the metal block 26 is spaced downwardly apart from the circuit board 10 and is secured to the top side of the heat transfer plate portion 24f by a screw 40 or other type of threaded fastener upwardly extended through an optional spacer 42, and an opening in the heat transfer plate portion 24f, and threaded into the metal block bore 28. Preferably, the underside of the metal block 26 is maintained in intimate heat conductive contact with the top side of the heat transfer plate portion 24f using a layer of heat conductive grease 44.

During operation of the microprocessor chip 16, heat generated by the internal chip die is sequentially conducted to the heat transfer plate portion 24f through the metal bottom chip cover portion 20, the heat conducting cement 38, the metal block 26 and the heat conductive grease 44. Heat transferred downwardly to the plate 24 in this manner is dissipated by convection (assisted in this heat transfer mode by the optional cooling fin structure 34) from the plate, and by conduction through the plate 24 to the metal housing chassis (via its illustrated wall 12) which serves as a heat sink for even greater heat dissipation. The downward spacing of the plate portion 24f from the underside of the printed circuit board 10 exposes both sides of this portion of the plate to air within the chassis housing, thereby enhancing convective heat dissipation from the plate portion 24f.

This heat dissipation technique of the present invention uniquely avoids the problems and limitations associated with the prior art method of attempting to dissipate heat from the top side of the ceramic body portion 18 of the microprocessor chip 16 using cooling fins attached thereto. As can be seen from the foregoing, in the present invention the chip heat is removed instead directly from much more thermally conductive metal underside portion 20 of the chip and dissipated through an extended heat sink collectively defined by the block 26, the plate 24, the cooling fin structure 34 (if used), and the metal housing chassis. Moreover, since there are no cooling fins mounted on the top side of the microprocessor chip 16, the important indicia typically imprinted thereon (such as the trademark, serial number and model number) is conveniently left unobscured by cooling apparatus.

The configuration and structure of the heat dissipation assembly 22 permits the microprocessor chip 16 to be easily and quickly installed on and removed from the printed circuit board 10. To install the chip 16, the metal block 26 is extended downwardly through the circuit board opening 36 and secured to the heat transfer plate portion 24f using the screw 40 and, if desired, the heat conductive grease 44. The heat conducting cement 38 is then applied to the top side of the installed metal block 26 (or to a central portion of the metal chip cover 20) and the chip is operatively inserted into its associated pin connector structure 14. This engages the metal underside portion 20 of the chip with the top side of the metal block 26, thereby slightly deflecting the plate portion 24f in a downward direction and cementing the chip 16 to the block 26.

To remove the installed chip 16 from the printed circuit board 10, the screw 40 is simply removed from the block 26 and the chip is pulled upwardly out of its connector structure 14, carrying the metal block 26 with it. A replacement chip may then be installed as described above, using another metal block 26.

The foregoing detailed description is to be clearly understood as being given by way of illustration and example only, the spirit and scope of the present invention being limited solely by the appended claims.

What is claimed is:

1. For use in connection with a microprocessor chip operatively and removably mounted on a first side of a printed circuit board in a spaced, parallel relationship therewith and having a metal underside section, the printed circuit board being disposed within a metal housing chassis, apparatus for dissipating internal operating heat generated by the microprocessor chip, comprising:

an opening formed through the printed circuit board and underlying a central portion of the metal underside section of the microprocessor chip;

a first thermally conductive member secured t the printed circuit board and having a first portion underlying the second side of the printed circuit board beneath said opening therein, said first portion being in a spaced relationship with the second side of the printed circuit board, and a second portion extending outwardly beyond an edge of the printed circuit board and having an outer end;

a second thermally conductive member removably extending through said printed circuit board opening and having first and second ends respectively facing the central portion of the metal underside section of the microprocessor chip and said first portion of said first thermally conductive member;

first means for fixedly securing said first end of said second thermally conductive member to the central portion of the metal underside section of the microprocessor chip in thermal communication therewith;

second means for removably securing said second end of said second thermally conductive member to said first portion of said first thermally conductive member in thermal communication therewith, said first portion of said first thermally conductive member resiliently biasing said second thermally conductive member toward the central portion of the metal underside section of the microprocessor chip; and third means for securing said outer end of said first thermally conductive member to the metal housing chassis.

2. The apparatus of claim 1 wherein:
said first thermally conductive member is a metal plate member.

3. The apparatus of claim 2 wherein:
said first portion of said first thermally conductive member underlies the second side of the printed circuit board in a parallel, spaced apart relationship therewith, and
said first thermally conductive member is secured to an edge portion of the printed circuit board.

4. The apparatus of claim 2 further comprising:
a convective cooling fin structure operatively secured to said second portion of said first thermally conductive member.

5. The apparatus of claim 1 wherein:
said second thermally conductive member is a metal block removably received in said printed circuit board opening.

6. The apparatus of claim 5 wherein said first means include:
a layer of heat conductive cement fixedly securing said first end of said second thermally conductive member to the central portion of the metal underside section of the microprocessor chip.

7. The apparatus of claim 5 wherein said second means include:
a threaded fastener member extending through said first portion of said first thermally conductive member and threaded into said second thermally conductive member.

8. The apparatus of claim 7 wherein said second means further include:
a layer of heat conductive grease interposed between said first portion of said first thermally conductive member and said second end of said second thermally conductive member.

9. The apparatus of claim 1 wherein said third means include:
bracket means carried by said outer end of said first thermally conductive member and connectable to a wall of the metal housing chassis.

10. Computer apparatus comprising:
a metal housing chassis having a wall;
a printed circuit board disposed with said metal housing chassis, said printed circuit board having an opening formed therein, a top side, a bottom side, and an edge portion spaced apart from said chassis wall;
a microprocessor chip operatively and removably mounted on said top side of said printed circuit board in an upwardly spaced, parallel relationship therewith, said microprocessor chip having a metal underside section with a central portion overlying said printed circuit board opening;
a metal heat conductor block removably received within said printed circuit board opening and having an upper end surface fixedly secured to said central portion of said metal underside section of said microprocessor chip, in thermal communication therewith, and a lower end surface spaced downwardly apart from said bottom side of said printed circuit board; and
a metal heat transfer plate secured to said printed circuit board and having a first portion underlying said lower end of said heat conductor block in a spaced apart, facing relationship with said bottom side of said printed circuit board and being removably secured to said lower end surface of said metal heat conductor block in thermal communication therewith, and a second portion extending outwardly beyond said edge portion of said printed circuit board and having an outer edge portion secured to said chassis wall in thermal communication therewith,
said first portion of said metal heat transfer plate resiliently biasing said metal heat conductor block toward said metal underside section of said microprocessor chip.

11. The computer apparatus of claim 10 further comprising:
a convective cooling fin structure mounted on said second portion of said heat transfer plate in thermal communication therewith.

12. Printed circuit board apparatus comprising:
a printed circuit board having first and second sides and an opening extending between said first and second sides;
a microprocessor chip removably mounted on said first side of said printed circuit board, said microprocessor chip having a metal underside section with a central portion overlying said printed circuit board opening;
a metal heat transfer plate anchored to said printed circuit board and having a cantilevered portion spaced apart from said second side of said printed circuit board in a parallel, facing relationship therewith and outwardly overlying said printed circuit board opening; and
a metal heat conductor block thermally communicating said metal underside section of said microprocessor chip with said metal heat transfer plate, said metal heat conductor block being fixedly secured to said central portion of said metal underside section of said microprocessor chip, removably extended through said printed circuit board opening from said microprocessor chip, and removably secured to said cantilevered portion of said metal heat transfer plate, said metal heat conductor block resiliently deflecting said cantilevered portion of said metal heat transfer plate away from said second side of said printed circuit board.

13. The printed circuit board apparatus of claim 11 wherein:

said printed circuit board has an edge portion spaced apart from said printed circuit board opening, said metal heat transfer plate is anchored to said edge portion of said printed circuit board, and said metal heat transfer plate has a second portion extending outwardly beyond said edge portion of said printed circuit board.

14. The printed circuit board apparatus of claim 12 further comprising:

a convective cooling fin structure mounted on said second portion of said heat transfer plate in thermal communication therewith.

15. The printed circuit board apparatus of claim 11 wherein:

said metal heat conductor block is fixedly secured to said central portion of said metal underside section of said microprocessor chip by a thermally conductive adhesive material, and is removably secured to said cantilevered portion of said metal heat transfer plate by a threaded fastener member extending through said cantilevered portion of said metal heat transfer plate and threaded into said metal heat conductor block.

* * * * *